United States Patent [19]

Fossel

[11] Patent Number: 4,918,021
[45] Date of Patent: Apr. 17, 1990

[54] PROCESS FOR THE DETECTION OF CANCER

[75] Inventor: Eric T. Fossel, Chestnut Hill, Mass.

[73] Assignee: The Beth Israel Hospital Association, Boston, Mass.

[21] Appl. No.: 295,746

[22] Filed: Jan. 10, 1989

Related U.S. Application Data

[63] Continuation-in-part of Ser. No. 833,840, Feb. 26, 1986, abandoned.

[51] Int. Cl.$^4$ .................................................. G01N 33/48
[52] U.S. Cl. ........................................ 436/64; 436/71; 436/173; 324/300; 324/307; 324/309; 128/653 R
[58] Field of Search .......................... 436/64, 71, 173; 324/300, 307, 309; 128/653

[56] References Cited

U.S. PATENT DOCUMENTS

| | | | |
|---|---|---|---|
| 3,420,634 | 1/1969 | Godsey | 436/173 X |
| 3,789,832 | 2/1974 | Damadian | 128/653 |
| 4,115,002 | 9/1978 | Morre et al. | 436/64 |
| 4,354,499 | 10/1982 | Damadian | 128/653 |
| 4,390,633 | 6/1983 | Merilan et al. | 436/173 X |
| 4,411,270 | 10/1983 | Damadian | 128/653 |
| 4,521,733 | 6/1985 | Bottomley et al. | 324/309 |
| 4,608,991 | 9/1986 | Rollwitz | 128/653 |

OTHER PUBLICATIONS

Serodiagnosis for Cancer, *Patent Abstracts of Japan*, vol. 5, No. 118, Akira Aisaka.
Nuclear Magnetic resonance Studies of Cancer, *Chemical Abstracts*, vol. 81, No. 25, Hollis, et al.
The Systemic Effect of cancer on human sera, *Chemical Abstracts*, vol. 101, No. 11, Beall et al.
Practical NMR Spectroscopy, M. L. Martin et al, Heyden & Son Ltd., 1980, pp. 38–43, paragraph 2.1: Resolution.
Identification and Characterization of Tissues by T$_2$-Selective Whole-Body Proton NMR Imaging, *Magnetic Resonance in Medicine*, vol. 2., No. 29, Gersonde et al.
Mountford et al., *Biochem. Biophys. Acta*, 720, (1982), pp. 65–74.
Chamberlain, the *Practice of NMR Spectroscopy*, Plenum Press (N.Y.), 1974 pp. 13–14.
Ohsaka et al., *Japan J. Meds. Sci Bio.*, 32, pp. 305–309; 1979.
Mountford et al., *Br. J. Cancer* (1980) 41, pp. 1000–1003.
Mountford et al., *Science*, vol. 226, (1984), pp. 1415–1417.
Floyd et al, *Cancer Research*, vol. 34, pp. 89–91, Jan. 1974.

(List continued on next page.)

Primary Examiner—Barry S. Richman
Assistant Examiner—Lynn M. Kummert
Attorney, Agent, or Firm—Lorusso & Loud

[57] ABSTRACT

A technique and an apparatus are disclosed for the detection of cancer using nuclear magnetic resonance (NMR). Specifically, NMR parameters for protons of lipid methyl and/or methylene groups are determined and compared against a corresponding value for healthy patients. In the preferred embodiments, an NMR spectrometer is employed to provide a spectrum for non-water components of blood, blood serum or blood plasma and the width of the methyl and/or methylene groups is measured at half-height as a determination of spin-spin relaxation time (T$_2$) which is the parameter used for purposes of comparison with healthy controls. Suppression of the water proton signal is employed where necessary in order to obtain a suitable spectrum for the non-water component protons. In the event that a positive reading is obtained, the level of plasma triglycerides is determined and if it is high, the patient's bodily fluid sample is further subjected to C-13 nuclear magnetic spectroscopy. The resonance line of the plasma C-13 spectra discriminates between true and false positive results from the proton NMR reading and determines the presence or absence of cancer in the patient.

41 Claims, 8 Drawing Sheets

OTHER PUBLICATIONS

Hazlewood et al, *J. of Nat'l Cancer Inst.,* vol. 52, No. 6, pp. 1849–1953, Jun. 1974.

McLachlan, *Phys. Med. Biol.,* vol. 25, No. 2, pp. 309–315, 1980.

Smith et al, *Radiology,* vol. 142, pp. 677–680, Mar. 1982.

Klinek et al, *Ginekol Pol.,* vol. 52, No. 6, pp. 493–502.

Beall et al, *NMR Basic Principles and Progress,* vol. 19, pp. 39–57, 1981.

Wieczorek et al, *Proc. Nat'l Acad. Sci. USA,* vol. 82, pp. 3455–3459, May 1985.

Mountford et al, *J. of Biochem. and Biophys. Meth.,* vol. 9, pp. 323–330, 1984.

A Proteolipid in Cancer Cells . . . , *Chemical Abstracts,* vol. 105 No. 11, Sep., 1986, Wright et al, p. 455, col. 2, Abstract No. 95403g.

FEBS Lett., vol. 203, No. 2, 1986, pp. 164–168, Wright et al, Jul. 1986.

Proton nuclear magnetic resonance . . . , *Anayltical Chemistry,* Rabenstein et al, pp. 3178–3184; pp. 3179, col. 2, paragraph 2, p. 3180, col. 1, paragraph 5, Dec. 1986.

A review of the Magnetic Resonance Response of Biological Tissue and Its Applicability . . . , Computed Tomography, Taylor et al., vol. 5, No. 2, 1961.

NMR relaxation in human blood serum . . . , *Database Biosis, (Biol. Abstracts) abstract 7019795, Rebokatov et al and Biofizika (USSR), vol. 27, No. 2, pp. 336–338, 1982.*

Proton NMR relaxation times in the peripheral blood . . . , *Database Biosis.* abstract No. 65047264, Ekstrand et al. and *Phy. Med. and Bio.,* vol. 22, No. 5, pp. 925–931, 1977.

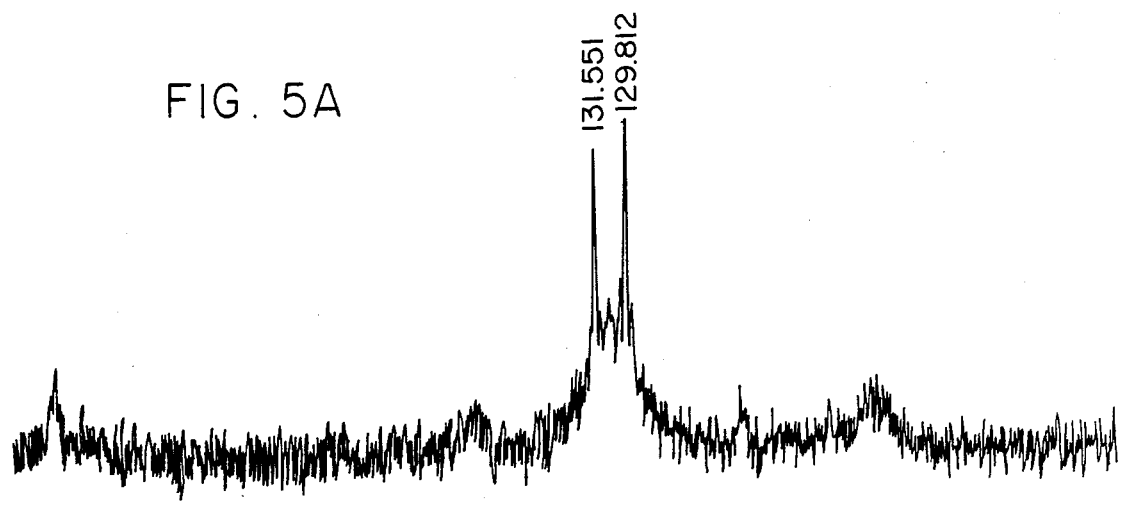
FIG. 5A
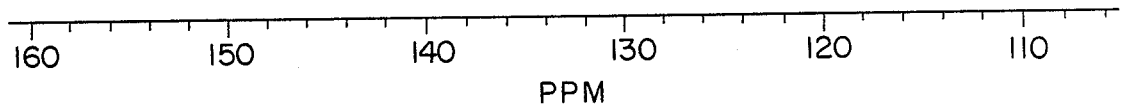
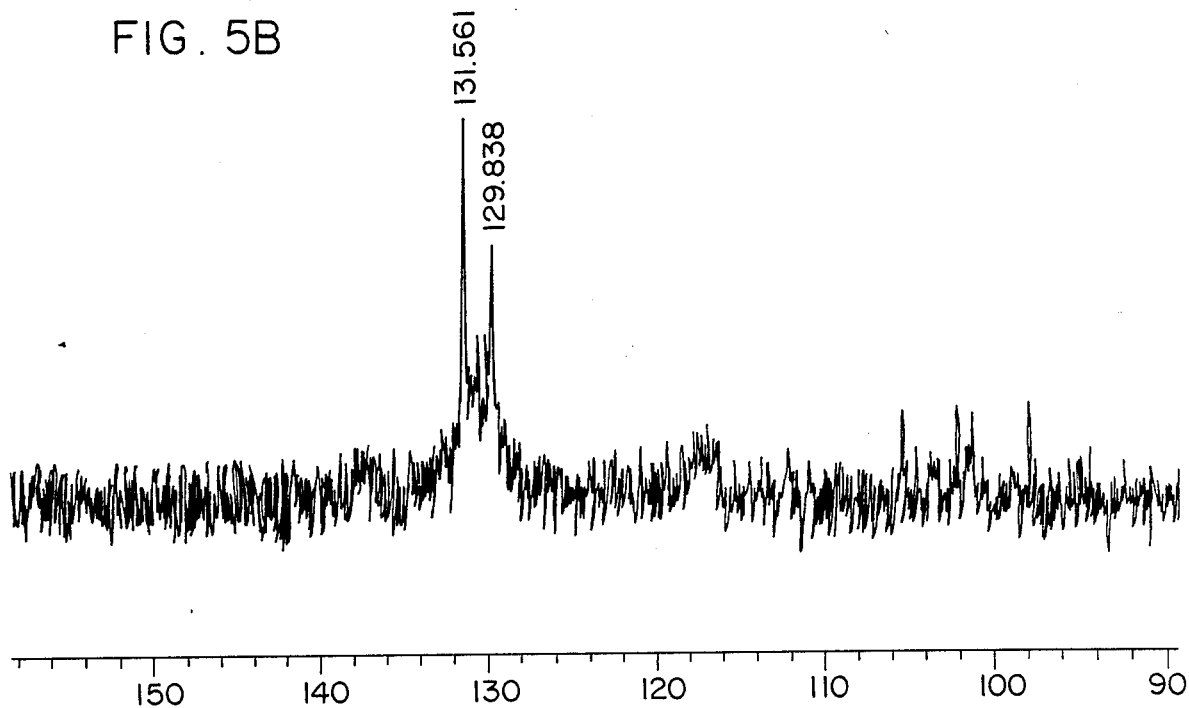
FIG. 5B

PROCESS FOR THE DETECTION OF CANCER

STATEMENT REGARDING FEDERALLY SPONSORED RESEARCH

The funding for work described herein was provided by the Federal Government, under a grant from the Department of Health and Human Services. The Government may have certain rights in the invention.

CROSS REFERENCE TO A RELATED APPLICATION

The present application is a continuation-in-part application of prior pending application U.S. Ser. No. 833,840 to Eric T. Fossel, filed February 26, 1986, now abandoned.

BACKGROUND OF THE INVENTION

1. Field of the Invention

The present invention relates to a diagnostic method and apparatus for the detection of cancer in a living patient.

2. Prior Art

Attempts utilizing the technique of nuclear magnetic resonance (NMR) to aid in arriving at a clinical diagnosis of cancer are well known in the prior art.

Damadian was the first to propose any medical use for nuclear magnetic resonance (NMR) and that was for the detection of malignancy in tissue. See R. Damadian, "Tumor Detection by Nuclear Magnetic Resonance," *Science* 171:1151-1153 (1971). U.S. Pat. No. 3,789,832 issued to Damadian covers an apparatus and method for application of nuclear magnetic resonance to surgically removed specimens to measure $T_1$ and $T_2$ for proton relaxation times, which values, compared against values for healthy tissue, were taken as an indication of cancer. U.S. Pat. Nos. 4,411,270 and 4,354,499 issued to Damadian cover apparatus and method for cancer detection with NMR imaging and scanning of whole-body specimens.

A number of other investigators also reported that nuclear magnetic resonance relaxation times ($T_1$) for water protons in organs of tumor-bearing animals have higher values than the corresponding $T_1$ for water structure in organs of healthy animals. See Frey et al, *J. Natl. Cancer Inst.* 49,903 (1972); Inch et al, *J. Natl. Cancer Inst.* 52,353 (1974); Iijima et al, *Physiol. Chem. and Physics* 5, 431 (1973); and Hazlewood et al, *J. Natl. Cancer Inst.* 52, 1849 (1974).

Today, despite uncertainty regarding mechanistic details, it is well known that biophysical changes which occur in malignant cells often result in alterations of the proton NMR signal. See D. G. Taylor et al, "A Review of the Magnetic Resonance Response of Biological Tissue and Its Applicability to the Diagnosis of Cancer by NMR Radiology," *Computed Tomography,* 5:122-133 (1981). Such changes form the physical basis for detection of tumors by proton NMR imaging. See R. Zimmerman et al, "Cerebral NMR: Diagnostic Evaluation of Brain Tumors by Partial Saturation Technique with Resistive NMR," *Neuroradiology* 27:9-15 (1985) and K. Ohtomo, "Hepatic Tumors: Differentiation by Transverse Relaxation Time ($T_2$) of Magnetic Resonance Imaging," *Radiology* 155:421-423 (1985). However, NMR imaging is not likely to be widely applied as a screening test for malignancy because of accessibility and economic factors.

Proton NMR studies on excised tumors, as well as on plasma and serum, from experimental animals and patients have often shown differences in the relaxation parameters $T_1$, $T_2$ and $T_2^*$, $T_2^*$ being a combination of $T_2$ from intrinsic relaxation and relaxation induced by magnetic field inhomogeneities, as a function of malignancy. Such findings have been reported by the following:

L. McLachlan, "Cancer-induced Decreases in Human Plasma Proton NMR Relaxation Rates," *Phys. Med. Biol.* 25:309-315 (1980);

F. Smith et al, "Nuclear Magnetic Resonance Imaging of the Pancreas," *Radiology* 142:677-680 (1982);

P. Beall et al, "The Systemic Effect of Elevated Tissue and Serum Relaxation Times for Water in Animals and Humans with Cancers," *NMR Basic Principles and Progress*, P. Diehl et al, Eds., 19:39-57 (1981);

R. Floyd, "Time Course of Tissue Water Proton Spin-lattice Relaxation in Mice Developing Ascites Tumor," *Cancer Res.* 34:89-91 (1974);

C. Hazlewood et al, "Relationship Between Hydration and Proton Nuclear Magnetic Resonance Relaxation Times in Tissues of Tumor Bearing and Nontumor Bearing Mice: Implications for Cancer Detection," *J. Natl. Cancer Inst.* 52:1849-1853 (1974); and R. Klimek et al, "A Discussion of Nuclear Magnetic Resonance (NMR) Relaxation Time of Tumors in Terms of Their Interpretation as Self-organizing Dissipative Structures, and of Their Study of NMR Zeugmatographic Imaging," *Ginekol Pol.* 52:493-502 (1981).

However, due to extensive overlap of groups and small differences between the means of groups, these methodologies are not clinically useful.

While most of the prior art mentioned above describes applications of NMR to analysis of tissue, it is also known to subject bodily fluids to such analysis. This is described, for example, by Beall et al., supra.

The foregoing prior art studies and methods, as well as all other prior art NMR methods for the detection of malignancy, rely on the observation of the composite NMR signal arising from all protons in the tissue or blood derived samples. This composite signal is dominated by the protons of water, obscuring the NMR signal from other proton-containing constituents of the sample. Indeed, the prior art believed that the apparent correlation between malignancy and observed changes in NMR parameters was due to "changes in water structure," quoting Frey et al., supra.

In other applications of proton NMR spectroscopy, it was known to suppress the signal from the solvent (such as water), in a sample.

It was discovered that the components of the NMR spectrum which have significant predictive value may be masked by other materials in the sample. By eliminating the masking, as by eliminating the water signal, the previously masked spectrum of these components was revealed. In co-pending application "Process for the Detection of Cancer Using Nuclear Magnetic Resonance," U.S. Ser. No. 833,840, filed February 26, 1986, the teachings of which are incorporated herein by reference, those discoveries were incorporated into a reliable method of diagnosing the presence of cancer in a living patient.

In accordance with that invention, a sample of a patient's bodily fluid is subjected to nuclear magnetic resonance spectroscopy to generate a nuclear magnetic resonance spectrum. A resonance line generated by a non-water component of the sample is selected, and the full width of this resonance line, e.g., at half its height, is measured. The full width so measured has proved to be a statistically reliable measure of the presence or absence of cancer in the patient.

The above described test of water-suppressed proton NMR of plasma discriminates between persons with untreated cancers and others with better than 90% accuracy. As such, the test was widely acclaimed as one of the most important inventions of the decade. No prior non-invasive test for cancer had reached even close to that level of accuracy. False positive results, however, have been obtained. In accordance with the present invention, It has been discerned that the major source of false positive results are those persons with high levels of plasma triglycerides.

Consequently, with the discovery of the present invention, a method and apparatus was developed to improve upon the accuracy of a non-invasive method to determine the presence of cancer in a living patient.

These and other objects and features of the present invention will become apparent to those skilled in the art from a reading of the description of the invention, taken together with the drawing, which follow.

SUMMARY OF THE INVENTION

Accordingly, the principal object of the present invention is to provide a method of confirming a diagnosis by NMR water suppressed proton method of the presence of cancer in a living patient.

Another object of the present invention is to provide a method to differentiate between true and false positive results obtained in a water suppressed proton NMR test in diagnosing the presence of cancer in a living patient.

Yet another object of the invention is to provide a method for detecting the presence of cancer in a patient which can be carried out on a sample of the patient's body fluid.

A further object of the present invention is to provide a method of diagnosing the presence of cancer in a living patient which is more accurate than previously known methods.

In accordance with the invention, a sample of a patient's bodily fluid is subjected to proton nuclear magnetic resonance spectroscopy to generate a nuclear magnetic resonance spectrum. A resonance line generated by a non-water component of the sample is selected, and the full width of this resonance line, e.g., at half its height, is measured. The full width so measured, as compared to a standard control, provides a statistically reliable indication of the presence or absence of cancer in the patient.

In the event that a positive reading is obtained in accordance with the present invention, the level of triglycerides is determined and if it is high, the patient's bodily fluid is further subjected to C-13 nuclear magnetic resonance spectroscopy. The resonance spectrum of the plasma C-13 spectra discriminates between true and false positive results to determine the presence or absence of cancer in the patient with a higher degree of accuracy than was previously possible.

In preferred embodiments, the bodily fluid is blood, spinal fluid, or bone marrow plasma; although blood plasma or serum is especially advantageous. False positive results in the initial proton NMR spectra due to hypertriglyceridemia can be distinguished by certain features of the plasma C-13 spectra.

BRIEF DESCRIPTION OF THE DRAWING

FIGS. 5A and 5B are C-13 NMR spectra of a plasma sample in the olefinic region for a normal control and an untreated cancer patient, respectively, obtained in accordance with the present invention.

DESCRIPTION OF THE PREFERRED EMBODIMENTS

Figure 1:
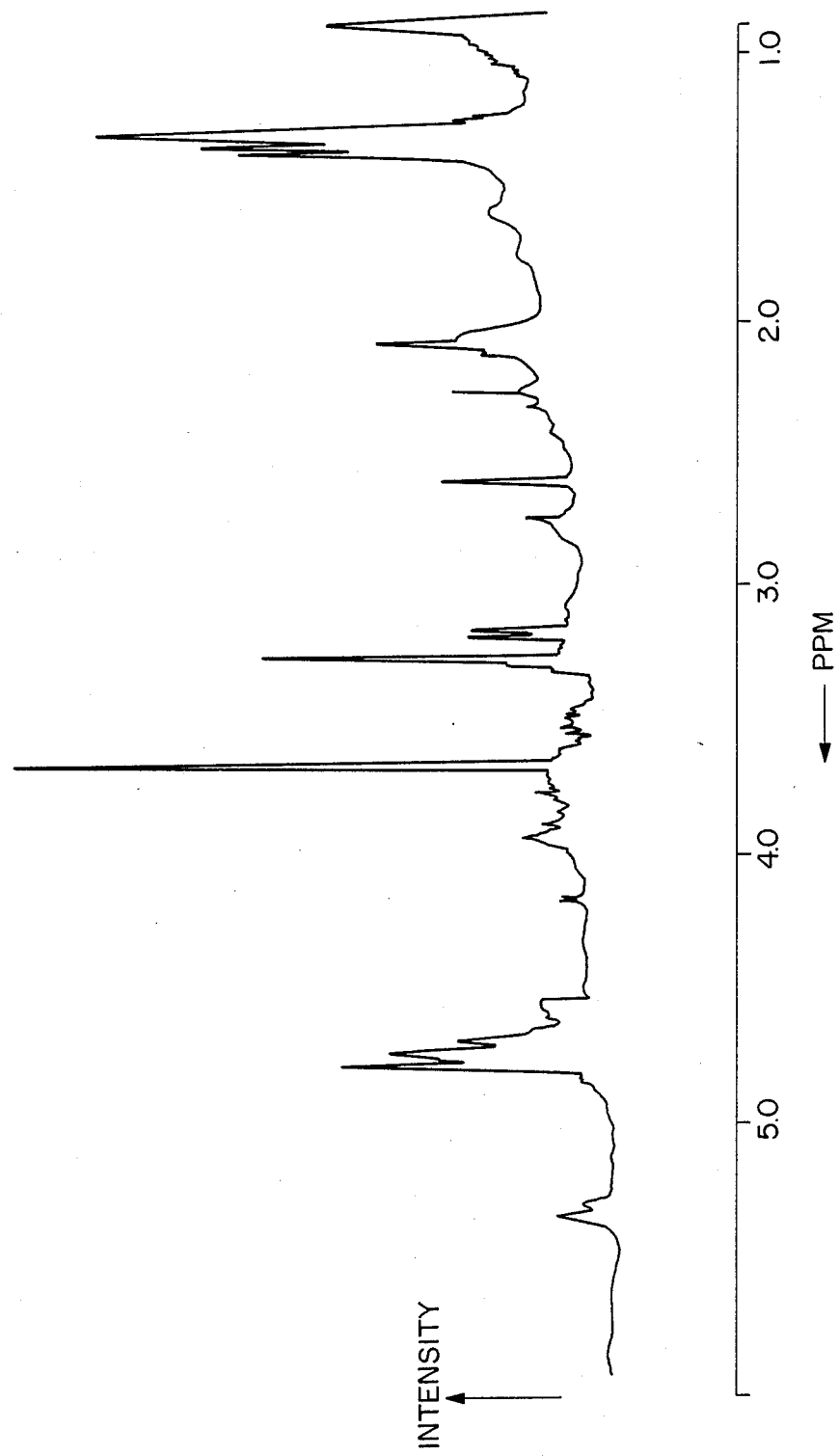
FIG. 1 is a typical 360 MHz NMR spectrum for the non-water components (water-suppressed) of a plasma sample from a healthy control obtained in accordance with the present invention.

At the outset the invention is described in its broadest overall aspects with a more detailed description following. The present invention is a method to detect the presence of cancer in a living patient. In accordance with the invention, a sample of a patient's bodily fluid is subjected to proton nuclear magnetic resonance spectroscopy to generate a nuclear magnetic resonance spectrum. Since components of the NMR spectrum which have significant predictive value may be masked by other materials in the sample, the masking is eliminated to produce the NMR spectrum. A resonance line generated by a non-water component of the sample is selected, and the full width of this resonance line, e.g., at half its height, is measured to provide a reliable measure of the presence or absence of cancer in the patient. The above procedure is described in co-pending application to Eric T. Fossel entitled: "Process for the Detection of Cancer Using Nuclear Magnetic Resonance", U.S. Ser. No. 833,840 filed February 26, 1986, the teachings of which are incorporated herein by reference.

In the event that a positive reading is obtained, this reading may indicate the presence of cancer in the patient, or it may be a false positive reading. It has been discovered that a major source of false positive readings are persons with high levels of plasma triglycerides.

Accordingly, in order to differentiate between true and false positive readings, the sample tested previously is subjected to C-13 NMR spectroscopy for those who have elevated triglyceride levels. The false positive results due to hypertriglyceridemia and, conversely, the presence of cancer in the patient, can be reliably determined from certain features of the C-13 spectra.

In one important embodiment of this invention, proton NMR spectroscopy is performed initially on the sample to be tested. The water suppressed proton NMR spectrum obtained on human blood plasma is dominated by the resonances of the plasma lipoprotein lipids. Without water suppression, these non-water resonances are virtually overwhelmed by the water. Signal averaging allows observation of resonances of some moieties associated with non-water bodily fluid components, at high magnetic fields, even in the presence of the water resonance. However, the capability of modern NMR spectrometers to suppress nearly completely the water proton resonance will facilitate this reading. The water suppressed proton NMR spectrum of plasma is essentially that of plasma lipoproteins and a few low molecular weight molecules. The protons of the proteins of plasma are obscured because they comprise a broad smear of unresolved resonances. The sharper resonances of the more mobile lipoprotein protons are superimposed on this broad background.

The process of the present invention operates on any lipid-containing bodily fluid, blood, or bone marrow plasma. Whole blood, serum or plasma may be used. While the test may be performed on any such lipid-containing body fluid, work to date has focused on blood plasma. In blood the lipids, inclusive of cholesterol, triglycerides and phospholipids, are present in the form of lipoproteins. The test for cancer will typically be performed in vitro, preferably on serum or plasma.

The selected fluid of a suspect patient or other person to be screened for cancer is exposed to a magnetic field and radio-frequency energy to generate a nuclear magnetic resonance signal which is then processed to obtain a value for the selected parameter, e.g., $W_{\frac{1}{2}}$, for lipid methyl and/or methylene protons. A relatively broad range of proton frequencies may be employed, e.g., 60 MHz and higher; 360 MHz or above is a preferred frequency. If cost is not a factor, 500 MHz may be the preferred frequency.

Figure 2:
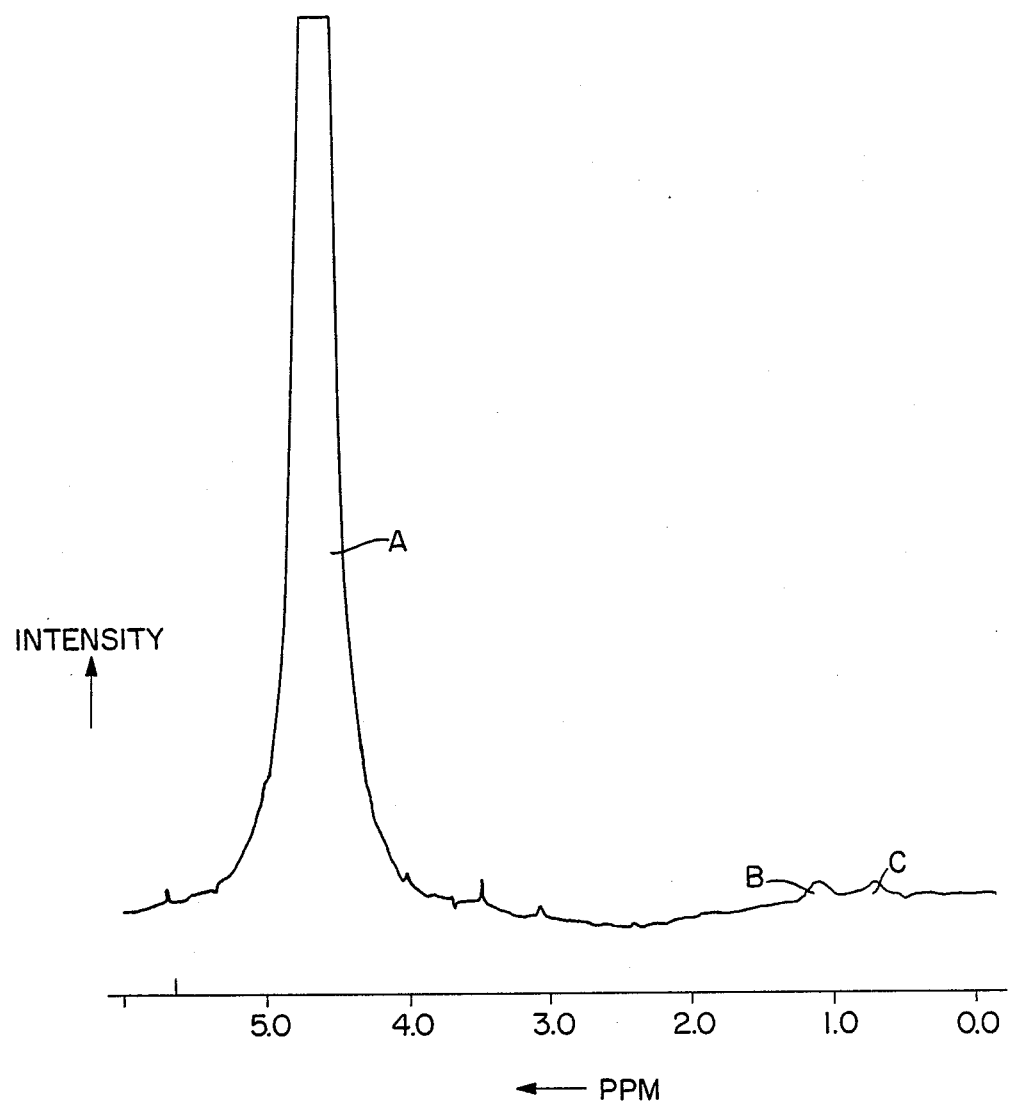
FIG. 2 is an NMR spectrum for the same plasma sample from which the spectrum of FIG. 1 was obtained, using the same equipment and pulse frequency, except without water suppression.
Figure 3:
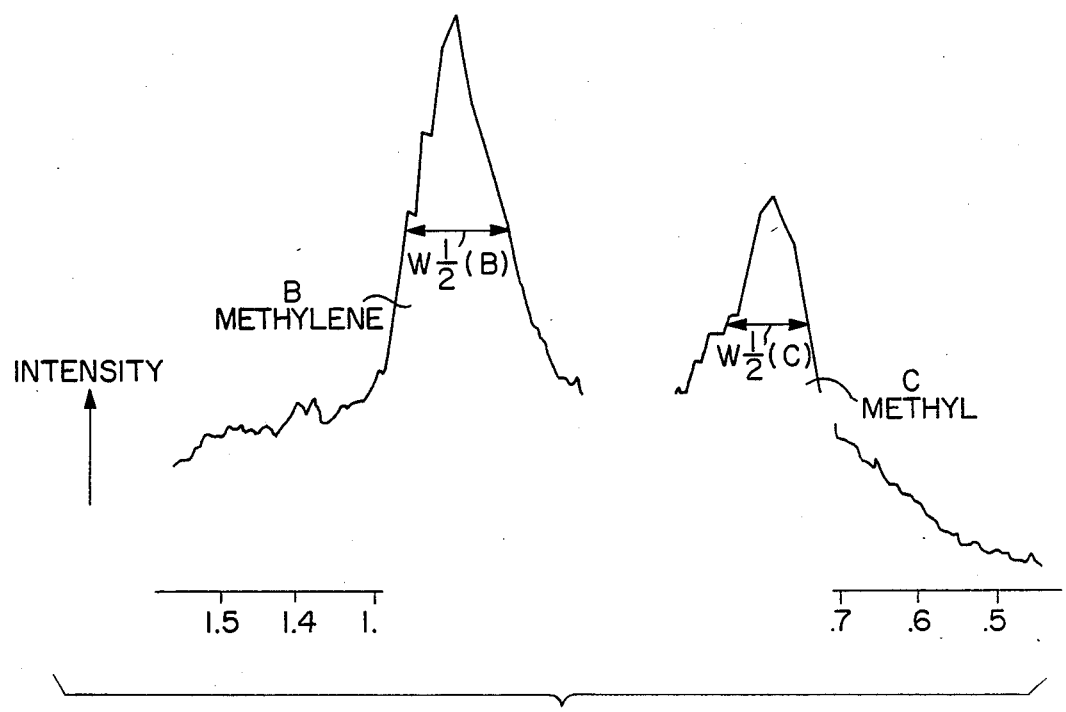
FIG. 3 is an expanded view of the methyl and methylene region of a normal control taken from the reading of the sample of FIG. 1.
Figure 4:
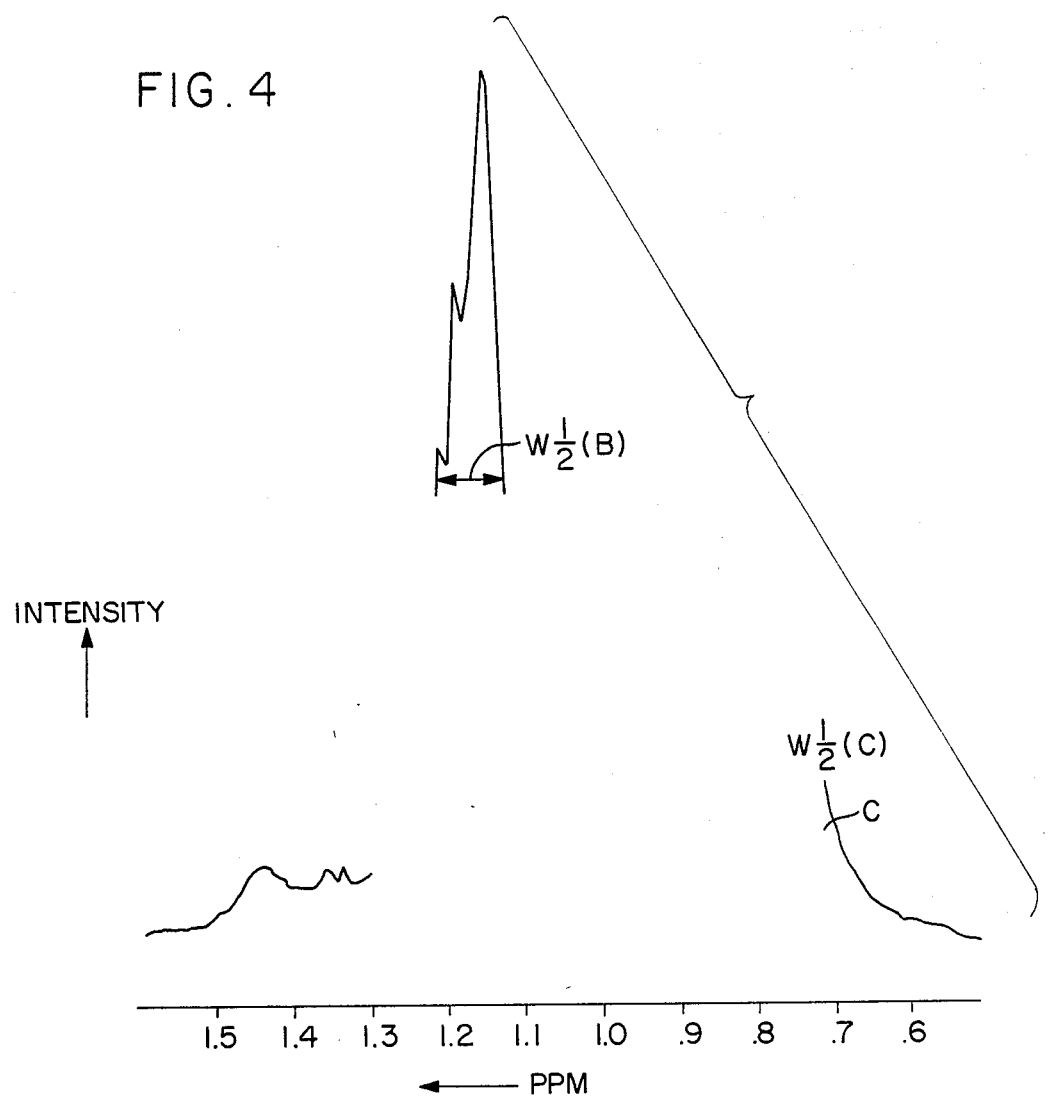
FIG. 4 is an expanded view of the methyl and methylene region of an NMR spectrum for a plasma sample for a patient with an untreated malignancy.

FIG. 1 shows a water suppressed proton spectrum of a healthy control, and FIG. 2 shows a proton spectrum of the same sample without water suppression. The truncated resonance line of water is denoted A in FIG. 2. The resonance lines between 0.5 and 2.0 ppm (parts per million of resonance frequency) arise from the methyl and methylene groups of the lipoprotein lipids. An expanded view of this region of the proton spectrum is shown in FIG. 3 for a normal control and in FIG. 4 for a patient with untreated malignancy. Accordingly, in its preferred embodiments, the present invention uses one of a number of conventional water suppression techniques, i.e., techniques for suppression of the water proton NMR signal. Numerous techniques have been devised to suppress the water proton NMR signal in other contexts. These may be broadly divided into two categories: (1) those that aim not to excite the water proton signal, e.g., rapid scan correlation spectroscopy and the selective excitation technique, and (2) those that arrange for the water proton magnetization to be extremely small at the time the observed radio frequency (rf) pulse is applied, e.g., the inversion recovery technique and saturation. These and other solvent suppression techniques are described by P. J. Hore in "Solvent Suppression in Fourier Transform Nuclear Magnetic Resonance," *Journal of Magnetic Resonance* 55:283-300 (1983) and the references footnoted therein. Although the water suppression technique is preferred when using conventional NMR apparatus due to their inability to distinguish between the signal of the solvent protons and those of the moiety or species of interest, a sufficiently sensitive apparatus would eliminate the need for water suppression altogether.

The linewidth at half-height of the resonances of moieties, e.g., methyl and methylene groups, associated with the lipids of plasma lipoproteins are treated as the variable of interest. Full width at half-height $W_{\frac{1}{2}}$ (linewidth) of an NMR resonance line is inversely proportional to the apparent spin-spin relaxation time ($T_2^*$), i.e. $W_{\frac{1}{2}} = 1/\pi T_2^*$ The detected value for the selected parameter is then compared with the corresponding parameter for the healthy controls. In a preferred embodiment, values for methyl and methylene are averaged and an average value of 33 Hz or less at a proton frequency of 360 MHz (8.45 T) or 400 MHz (9.40 T) is taken as an indication of malignancy.

If a positive reading is obtained from the water suppressed proton NMR spectrum of a plasma sample from a patient, a second level of testing to confirm the diagnosis is performed. First, a conventional test, commonly called a triglyceride analysis, is performed to determine the triglyceride level of the patient. If the triglyceride level is normal, the positive reading from the water-suppressed proton NMR spectroscopy is a true positive and indicates the presence of cancer in the patient. If the triglyceride level is above normal, in order to differentiate between true and false positive results, a C-13 NMR spectra on the plasma sample already obtained from the patient is conducted.

False positive results due to hypertriglyceridemia can be reliably distinguished from true positive results by substantial differences in certain features of the plasma C-13 spectra. Accordingly, the plasma sample already obtained from the suspect patient to be screened is exposed to a magnetic field and radio frequency energy to generate a nuclear magnetic signal which is then processed to obtain a value for C-13.

Initially, the olefinic region, 120-140 ppm, of the spectra is examined. Two peaks will appear, one at approximately 128-129 ppm and another at approximately 130-131 ppm, said peaks appearing about 2 ppm apart. The ratio of the resonance at the general region of 128 ppm to that at 130 ppm is indicative. In readings of plasma from normal controls and from persons with non-cancer disease, the ratio of the height of those two resonances (128/130 ppm) is 0.9 or greater, i.e. the resonance peak at 128 ppm is approximately equal to or taller than that at 130 ppm. The heights of the peaks are measured with a ruler or computer from the center of the baseline noise to the top of the peak. In readings of plasma from patients with untreated cancer, the ratio of the peak heights is less than 0.86, or the resonance peak at 130 ppm is taller by at least 5% than that at 128 ppm. It should be noted that in patients with hypertriglyceridemia, the ratio of the height of the resonances (128/130 ppm) is the same as normal control values.

FIGS. 5A and 5B shows the olefinic region for spectra taken at 125.76 MHz with broadband proton decoupling from a normal control patient and an untreated cancer patient, respectively. In FIGS. 5A and 5B, the ratio is 1.14 in the normal control patient and 0.70 in the untreated cancer patient. In the patients with hypertriglyceridemia that were studied, the ratio ranged from 1.05 to 1.68.

The changes in the olefinic region of the spectra of untreated cancer patients can be explained by increases or decreases in polyunsaturated fatty acid chains in the lipids. The levels of oleic acid and linoleic acid are particularly indicative.

Oleic acid is a monounsaturated fatty acid and is made by the human body. Linoleic acid is a polyunsaturated fatty acid, having two double bonds, and is not made by the human body, but is obtained by consumption. Dietary fatty acids include polyunsaturated acids, such as linoleic acid. A resonance peak in the general region of 128–129 ppm evidences only linoleic acid in the patient. A resonance peak at the general region of 130–131 ppm evidences both oleic and linoleic acid in the patient.

It has been discovered that the height of those resonance peaks, relative to each other, are affected by certain conditions of the patient. For example, persons with high triglyceride levels usually have a high ratio of linoleic acid to oleic acid levels. Patients with untreated cancer are found to have low levels of linoleic acid in their bodies, presumably because cancer causes a oxidation of polyunsaturated fatty acids, including linoleic acid. This is consistent with the hypothesis that lipids are oxidized by hydroxyl free radicals in cancer patients since polyunsaturated fatty acids are most susceptible to oxidation.

Accordingly, if the subject patient has both high triglycerides and untreated cancer, the resonance peak at 130 ppm will be higher, reflecting the decreased linoleic acid in both peaks. If, however, the peak at 128 ppm is not shorter than that at 130 ppm by more than 7%, no depression, or an insignificant depression, of linoleic acid levels has occurred and the positive result obtained from the proton NMR spectra is confirmed as a false positive and no cancer is present.

Figure 6B:
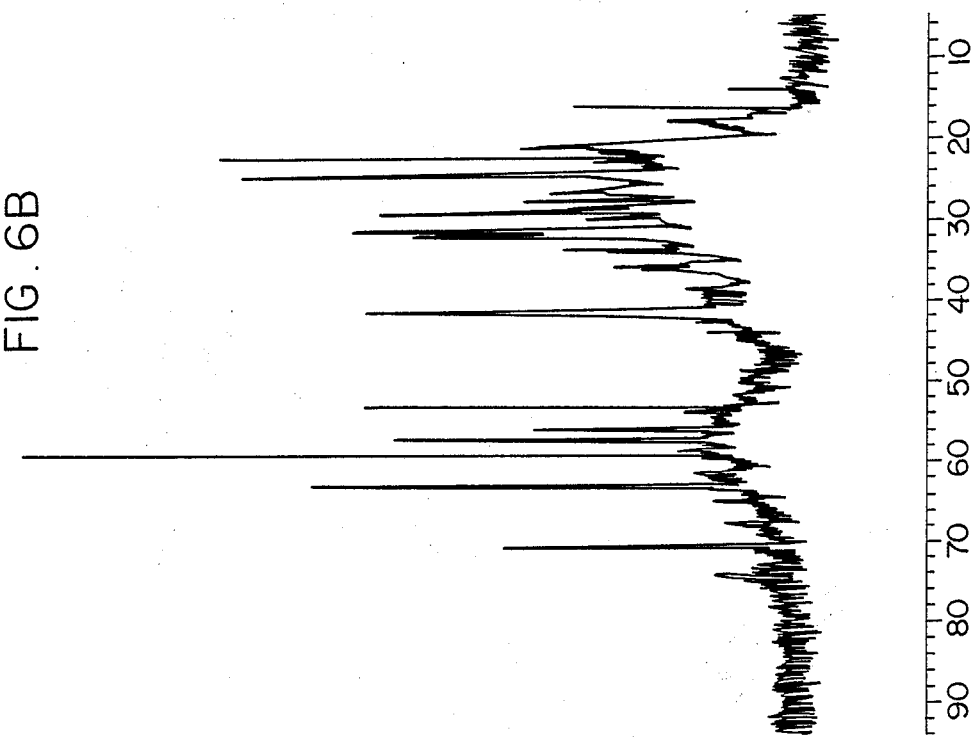
FIGS. 6A and 6B are views of the C-13 NMR spectral region between 10 and 90 ppm, with particular inclusion of the region 48 ppm and 80 ppm, of the plasma samples shown in FIG. 5 for a normal control and an untreated cancer patient, respectively, obtained in accordance with the present invention.
Figure 6A:
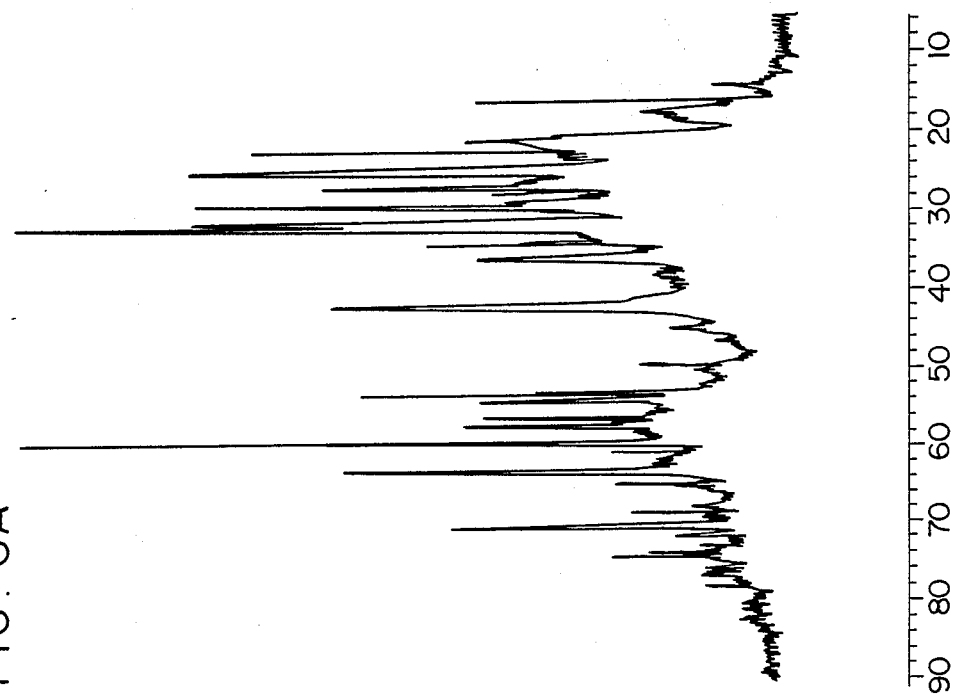

In addition, the spectral region between 48 ppm and 80 ppm is far more complex in untreated cancer plasma than in normal control or hypertriglyceridemia plasma. By "more complex" is meant that there are more resonance peaks in the region. A resonance peak is counted if its height is 50% greater or more than that of the background noise during a normal testing period. As those skilled in the art will know, the longer data is collected, the noise will lessen and peaks will show more clearly. FIGS. 6A and 6B shows this region for normal control and untreated cancer plasma, respectively. These spectra were obtained at 125.76 MHz using a 5 mm sample tube and 14 hour accumulations. C-13 spectra with adequate information can also be obtained at 90.5 MHz in 10 mm or longer sample tubes. Of course, changes to various parameters of the conditions under which the test can be run will be evident to those skilled in the art.

These parameters include the size of the sample tube, the pulse width, the pulse repetition rate, and the exponential multiplication of the free induction decay by different factors, For example, it is obvious to those skilled in the art that the bigger the sample tested, the faster spectra of adequate quality will be obtained. Other changes to the conditions given here will be evident to those skilled in the art.

C-13 NMR spectroscopy can be performed initially on a patient as a method to diagnose the presence of cancer, without first performing a proton NMR spectroscopy as described above. The C-13 NMR spectroscopy, however, is time consuming, therefore expensive to perform. While a proton NMR spectroscopy generally takes 30 seconds to perform, C-13 spectroscopy may take anywhere from one to fifteen hours. This increases costs accordingly. Accordingly, in a preferred embodiment, C-13 spectroscopy is used to verify the positive results obtained from the proton NMR spectra and illuminates statistically and clinically significant differences in a plasma C-13 spectra between true and false positive results from the proton water suppressed NMR spectroscopy test.

Any conventional modern NMR spectrometer may be used in the practice of the present invention. In the preferred embodiments, an NMR spectrometer with a magnet at constant field strength is used and the NMR signal is Fourier transformed, with the full linewidth at half-height for proton resonances of methyl and methylene groups, and then C-13 resonances of linoleic and oleic acid, being the NMR parameters of interest.

As noted in parent application, U.S. Ser. No. 833,840, correct sample preparation and execution is essential to carry out a successful measurement on plasma. Blood is collected in tubes containing 70 $\mu$l of a solution of 15% $Na_2$ EDTA. Blood was maintained at 4° C. until centrifugation. Plasma was separated and stored at 4° C. until NMR analysis. Plasma samples were never frozen because freezing destroys lipoprotein lipid structural integrity. Samples which showed any visible sign of hemolysis were excluded.

All spectra were obtained at 20°–22° C. magnetic field strengths of 360 MHz or greater. The samples were shimmed individually on the area of the proton free induction decay until the full width at half height of the water resonance was 4 Hz or less. Of course, careful shimming is an assumed component of good NMR laboratory technique.

It can be seen that of those experimental conditions, temperature and shimming are not as critical with the C-13 NMR spectroscopy because a measurement of the linewidth is not taken. Of course, the field strength used will determine the length of time in which a sample is taken. In addition, to the experimental conditions, accurate results require careful review of a patient's medical record to arrive at the patient classification.

Figure 7:
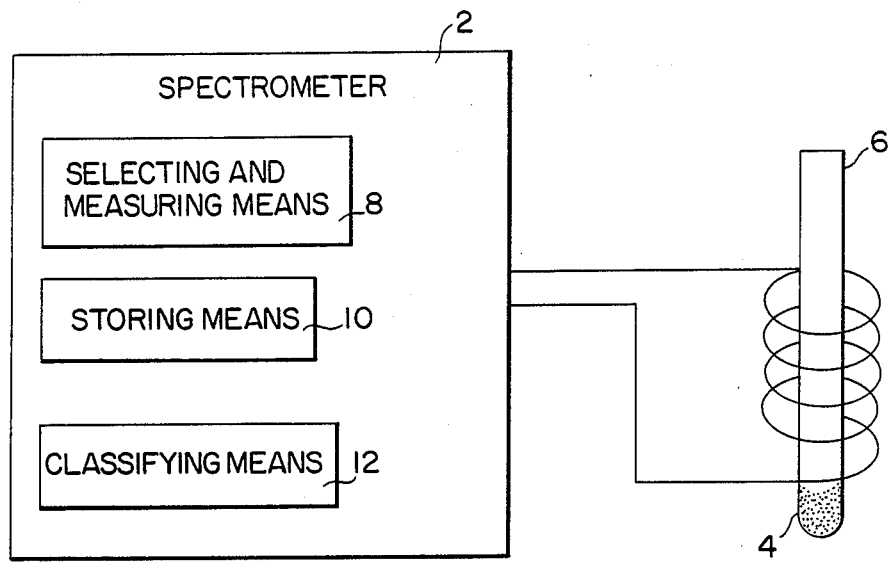
FIG. 7 schematically illustrates the apparatus of the present invention.

Referring now to FIG. 7, there is illustrated a nuclear magnetic resonance (NMR) spectrometer 2 which in the preferred embodiment is capable of performing proton and C 13 NMR spectroscopy and which is preferably, but not necessarily, of the type that suppresses the NMR signal of water. The spectrometer 2 is adapted for examination of a sample 4, which in this example is human blood plasma contained within a test tube 6.

In accordance with the invention, the spectrometer 2 contains means 8 for selecting at least one and preferably a plurality such as two NMR resonance lines in the NMR spectrum of the sample 4 and measuring the linewidth of the line or lines so selected. Preferably, the linewidth is measured at half the height of the line, but this is not necessary and linewidth can be measured at any predetermined fraction of the height of the line in question. Measurement at half of line height is preferred because this is a standard measurement carried out in the field of NMR spectroscopy.

Spectrometer 2 also contains means 8 for measuring selected peaks, useful for the examination of the C-13 NMR spectra. The spectrometer 2 also is of conventional construction and includes in addition to all its other structure a means 10 for storing a value or range of values. In the preferred embodiment, a linewidth which is either measured directly or derived from a plurality of such direct measurements is compared with a value or range of values which represents the value or range of values to be expected from normal patients, i.e.

patients who are free of cancer. In accordance with the invention, the spectrometer 2 also includes means 12 for classifying the measured or derived linewidths peak heights and number of peaks as normal (i.e. cancer-free) or abnormal (i.e. cancerous) based upon the stored information. This may be done by comparison, subtraction, or any other appropriate mathematical operation.

In the preferred embodiment, the selecting and measuring means 8 is pre-adjusted to measure the linewidths of the methyl and methylene groups of the lipoprotein lipids, and the peak heights and number of peaks in the C 13 NMR spectra. This may include suppressing the signal of water from the NMR spectrum of the sample 4, or may alternatively be done directly where the spectrometer 2 is sensitive enough to do so.

In the preferred embodiment, the linewidths of the methyl and methylene groups are averaged to produce a composite linewidth which is the mathematical mean of the two. This composite linewidth is preferably then compared with 33 Hz, the value which is preferably stored in the means 10. The actual comparison indicates that the composite linewidth is less than 33 Hz, this indicates an abnormal (i.e. cancerous) sample 4. Typical spectrometers that can perform the method of the present invention are the Bruker AM-360 and the Bruker AM-500. Of course, others skilled in the art will know of similar equipment to perform that step of the present invention.

EXAMPLE

In this example, the method of the present invention was applied to a group of 135 patients undergoing breast biopsy for palpable and non-palpable breast lesions. For the prospective breast study, blood was collected and maintained at 4° C. until centrifugation. Blood was collected in non-siliconized vacutainer tubes containing 70 $\mu$l of a solution of 15% Na$_2$EDTA. Plasma was separated and stored at 4° C. until NMR analysis. Plasma samples were never frozen because freezing destroys lipoprotein lipid structural integrity. Samples which showed any visible sign of hemolysis were excluded.

Plasma triglyceride concentrations were measured (Damon Clinical Laboratories, Westwood, Massachusetts) on all fresh plasma samples. All spectra were obtained at 21° C. using an 8.45 T Bruker AM spectrometer operating at 360 MHz for proton (H-1) and 90.5 MHz for carbon (C-13). Additional C-13 spectra were obtained on an 11.8 T Bruker AM spectrometer operating at 125.7 MHz. All studies were carried out in 5 mm OD sample tubes (Wilmad, Vineland, New Jersey; #507PP or #528PP). Each sample, containing 0.6 ml plasma, was shimmed individually on the area of the proton free induction decay (FID) until the full-width at half-height (FWHH) of the water resonance was 4 Hz or less. An internal quality control was found in the linewidth of the EDTA resonances. If all was well with the sample preparation and shimming, the linewidth (FWHH) of the EDTA resonances (without exponential broadening) had to be 2 Hz or less and was often between 1.0–1.5 Hz. In order to accomplish this, most H-1 probes require detuning to avoid radiation damping. The probe was detuned until the 90° radio-frequency pulse became 20 msec. In the 8.45 T spectrometer, this resulted in probe detuning of about 2 MHz. The sample was spun during shimming of the Z shim coils and during data acquisition. Our H-1 spectra were acquired using presaturation to suppress water and an inversion-recovery sequence to null any lactate methyl protons present. The presaturation pulse was 4.0 sec, with a delay of about 0.8 sec between the 180° and 90° pulse. Eight FIDs were signal averaged and then Fourier transformed following multiplication by an exponential resulting in 2 Hz line-broadening. The portion of the spectrum form 0.5 to 1.6 ppm was phased so that the baseline level at the edges of the plot was the same. This resulted in defective phasing of other (non-plotted) portions of the spectra.

C-13 spectra were obtained at 8.45 T and 11.5 T signal with broadband proton decoupling by averaging between 2,000 and 28,000 FIDs depending on signal-to-noise level and resolution desired. The sample was identical to the samples for H-1 spectra except 100 $\mu$l D$_2$O was added for field lock. It was found that a minimum of 2,000 FIDs were required to produce reliable resonance intensities. Exponential multiplication equivalent to 25 Hz line-broadening was used in the spectra obtained at 8.45 T.

Figure 8:
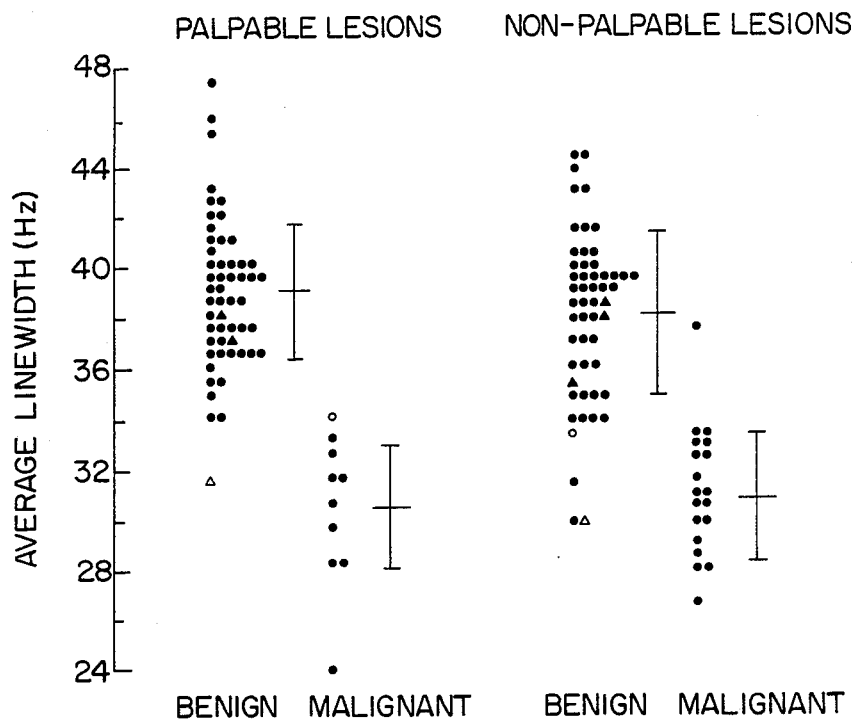
FIG. 8 shows the results of a study performed using the method of the present invention.

In this study, we prospectively obtained plasma from a series of women undergoing breast biopsy. Samples were drawn prior to the biopsy, analyzed by NMR, and results were then correlated with pathology reports. Two groups of patients were included in this study; 63 patients with palpable lesions and 72 patients with mammographically discovered, non-papable lesions requiring wire localization. Results of the H-1 NMR spectroscopic evaluation are shown in FIG. 8. In both groups, benign lesions were clearly distinguished from malignant ($p<0.0001$) based upon the proton values. For those values, triangles indicate patients who also elevated triglyceride values. The open symbols indicate samples in which the C-13 results conflicted with the proton results. Thus, for the open symbols, the sample would be changed from the benign column to the malignant column or vice versa.

The patients in the study were a group of otherwise healthy women, outpatients, referred for evaluation because of an abnormality on a routine breast examination or a screening mammogram. In this group, the sensitivity and specificity were 93% and 95%, respectively. The predictive value of a positive test was 84%, and the predictive value of a negative test was 98%. Reclassifying patients on the basis of the C-13 data raises the sensitivity and specificity to 97% and 98%, respectively, and the predictive value of a positive test to 93%. These data would suggest that the H-1 NMR linewidth, confirmed by a C-13 ratio, might be used as an aid in decision making in patients with breast lesions.

There were five apparent false positive and two false negative results. Elevated triglyceride levels (265 mg/dl and 206 mg/dl) were associated with two of the five false positives and no false negatives. The C-13 ratio was negative in three false positives, two of which also had elevated triglycerides; and it was positive in two patients. The C-13 ratio was positive in all but one of the cases with malignant breast biopsies. The one false negative by C-13 was also negative by H-1. While patients with elevated triglyceride levels may need to be evaluated also by C-13, not all patients with elevated triglycerides had narrowed linewidths.

The invention may be embodied in other specified forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range or equivalency of the claims are therefore intended to be embraced therein.

What is claimed is:

1. A method of diagnosing the presence of cancer in a living patient, comprising the following steps:
   (a) subjecting a blood component sample from a patient to be tested to proton nuclear magnetic resonance spectroscopy to generate a NMR spectrum from which undesirable signals have been suppressed;
   (b) selecting a lipoprotein resonance line for lipid peaks in said spectrum;
   (c) measuring the full width at half-height of said resonance line;
   (d) classifying the full width measured into either a category of normal full widths or into a category of abnormal full widths as compared to a predetermined standard for which abnormal full widths indicate the presence of cancer;
   (e) for measured full width readings classified as abnormal in step (d), measuring the triglyceride level of the blood component sample;
   (f) classifying the triglyceride level so measured into a category of normal levels or above normal levels;
   (g) for component samples having above normal levels of triglycerides, subjecting the blood component sample to C-13 nuclear magnetic resonance spectroscopy to generate an NMR spectrum;
   (h) classifying the NMR spectrum into a category of normal spectrum or into a category of abnormal spectrum as compared to a predetermined standard for which abnormal spectrum indicate the presence of cancer.

2. The method of claim 1, wherein said subjecting step of the proton NMR spectroscopy
   (a) includes suppressing the water signal.

3. The method of claim 1, wherein said subjecting step of the proton NMR spectroscopy
   (a) comprises obtaining a blood sample from the patient, removing red cells therefrom, and subjecting plasma in the blood sample to nuclear magnetic resonance spectroscopy.

4. The method of claim 1, wherein the proton resonance is above 60 MHz.

5. The method of claim 4, wherein the proton resonance is equal to or above 360 MHz.

6. The method of claim 1 wherein the C-13 resonance spectrum at 128 ppm and 130 ppm is indicative of the presence of cancer.

7. The method of claim 6 wherein the C-13 resonance spectrum between 48 and 80 ppm is indicative of the presence of cancer.

8. A method of diagnosing the presence of cancer in a living patient, comprising the following steps:
   (a) subjecting a blood component sample from a patient to be tested to nuclear magnetic resonance spectroscopy to generate an NMR spectrum from which undesirable signals have been suppressed;
   (b) selecting a plurality of lipoprotein resonance lines from lipid peaks in said spectrum;
   (c) measuring the full width at half-height of each of said resonance lines;
   (d) deriving from all full widths so measured a composite linewidth;
   (e) classifying the composite linewidth derived into a category of normal composite linewidths or into a category of abnormal composite linewidths as compared to a predetermined standard for which abnormal composite linewidths indicate the presence of cancer;
   (f) for measured composite linewidths classified as abnormal composite linewidths, measuring the triglyceride levels of the blood component sample;
   (g) classifying the triglyceride level so measured into a category of normal levels or above-normal levels;
   (h) for blood component samples having above-normal levels of triglycerides, subjecting the blood component sample to C-13 nuclear magnetic resonance spectroscopy to generate an NMR spectrum;
   (i) classifying the C-13 NMR spectrum into a category of normal C-13 spectrum or into a category of abnormal C-13 spectrum as compared to a predetermined standard for which abnormal spectrum indicate the presence of cancer.

9. The method of claim 8 wherein said deriving step comprises the step of computing the mathematical mean of the full widths measured.

10. The method of claim 8 wherein said plurality of resonance lines is two.

11. The method of claim 8 wherein the C-13 resonance spectrum at 128 and 130 ppm is indicative of the presence of cancer.

12. The method of claim 11 wherein the C-13 resonance spectrum between 48 and 80 ppm is indicative of the presence of cancer.

13. A method of diagnosing the presence of cancer in a living patient, comprising the following steps
   (a) subjecting a lipid-containing bodily fluid sample from a patient to be tested to nuclear magnetic resonance spectroscopy to generate an NMR spectrum;
   (b) selecting an NMR resonance line in said spectrum from a non-water component of said sample;
   (c) measuring the full width at half-height of said resonance line;
   (d) classifying the full width measured into either a category of normal full widths or into a category of abnormal full widths as compared to a predetermined standard for which abnormal full widths indicate the presence of cancer;
   (e) for measured full widths classified as abnormal full widths, measuring the triglyceride levels of the sample;
   (f) classifying the triglyceride level so measured into the category of normal levels or above normal levels;
   (g) for samples having above normal levels of triglycerides, subjecting the sample to C-13 nuclear magnetic resonance spectroscopy to generate an NMR spectrum;
   (h) classifying the NMR spectrum into a category of normal spectrum or into a category of abnormal spectrum as compared to a predetermined standard for which abnormal spectrum indicate the presence of cancer.

14. The method of claim 13 wherein the non-water component is a lipid.

15. The method of claim 14 wherein the sample is blood plasma, spinal fluid or bone marrow plasma, and wherein said selected resonance line is from the methyl and/or methylene groups of the lipoprotein lipids.

16. The method of claim 13 wherein the C-13 resonance spectrum at 128 and 130 ppm is indicative of the presence of cancer.

17. The method of claim 16 wherein the C-13 resonance between 48 and 80 ppm is indicative of the presence of cancer.

18. A method of diagnosing the presence of cancer in a living patient, comprising the following steps:
(a) subjecting a lipid-containing bodily fluid sample from a patient to be tested to nuclear magnetic resonance spectroscopy to generate an NMR spectrum;
(b) selecting a plurality of NMR resonance lines in said spectrum from a non-water component of said sample;
(c) measuring the full width at half-height of each of said lines;
(d) deriving from all full widths so measured a composite linewidth;
(e) classifying the composite linewidth so derived into a category of normal composite linewidths or into a category of abnormal composite linewidths as compared to a predetermined standard for which abnormal composite linewidths indicate the presence of cancer;
(f) for measured composite linewidths classified as abnormal composite linewidths, measuring the triglyceride levels of the sample;
(g) classifying the triglyceride level so measured into a category of normal levels or above-normal levels;
(h) for samples having above normal levels of triglycerides, subjecting the sample to C-13 nuclear magnetic resonance spectroscopy to generate an NMR spectrum;
(i) classifying the NMR spectrum into a category of normal spectrum or into a category of abnormal spectrum as compared to a predetermined standard for which abnormal spectrum indicate the presence of cancer.

19. The method of claim 18 wherein the C-13 resonance spectrum at 128 and 130 ppm is indicative of the presence of cancer.

20. The method of claim 19 wherein the C-13 resonance between 48 and 80 ppm is indicative of the presence of cancer.

21. A method of diagnosing the presence of cancer in a living patient, comprising the following steps:
(a) subjecting a sample of blood plasma, bone marrow plasma or spinal fluid to proton nuclear magnetic resonance spectroscopy to generate an NMR spectrum from which the water signal has been suppressed;
(b) selecting the resonance lines of the methyl and methylene groups of the lipoprotein lipids in said spectrum;
(c) measuring the full width at half-height of each of said resonance lines;
(d) computing an average width from the full widths so measured;
(e) classifying the average width computed into the category of normal average widths or into the category of abnormal average widths as compared to a predetermined standard for which abnormal average widths indicate the presence of cancer;
(f) for measured composite linewidths classified as abnormal composite linewidths, measuring the triglyceride levels of the blood component sample;
(g) classifying the triglyceride level so measured into a category of normal levels or above normal levels;
(h) for samples having above normal levels of triglycerides, subjecting the sample to C-13 nuclear magnetic resonance spectroscopy to generate an NMR spectrum;
(i) classifying the NMR spectrum into a category of normal spectrum or into a category of abnormal spectrum as compared to a predetermined standard for which abnormal spectrum indicate the presence of cancer.

22. The method of claim 21 wherein the C-13 resonance spectrum at 128 and 130 ppm is indicative of the presence of cancer.

23. The method of claim 22 wherein the C-13 resonance between 48 and 80 ppm is indicative of the presence of cancer.

24. A method for detecting cancer comprising:
(a) establishing a standard value for at least one NMR parameter for nuclei of at least one moiety associated with a constituent, other than water, of a lipid-containing bodily fluid of cancer-free subjects;
(b) exposing the same type bodily fluid of a subject to be diagnosed for cancer to a magnetic field and radio-frequency energy to generate a nuclear magnetic resonance spectrum;
(c) processing the nuclear magnetic resonance spectrum to obtain a value for said at least one parameter of said at least one moiety nuclei;
(d) comparing the standard value established for said at least one parameter with the value obtained for said fluid exposed;
(e) classifying the value so established for said fluid exposed into either a category of normal or into a category of abnormal as compared to a predetermined standard for which abnormal values indicate the presence of cancer;
(f) for measured values classified as abnormal values, measuring the triglyceride levels of the bodily fluid;
(g) classifying the triglyceride level so measured into the category of normal levels or above normal levels;
(h) for bodily fluids samples having above normal levels of triglycerides, subjecting the bodily fluid to C-13 nuclear magnetic resonance spectroscopy to generate an NMR spectrum;
(i) classifying the NMR spectrum into a category of normal spectrum or into a category of abnormal spectrum as compared to a predetermined standard for which abnormal spectrum indicate the presence of cancer.

25. A method in accordance with claim 24 wherein said lipid-containing bodily fluid is blood, blood serum or blood plasma.

26. A method in accordance with claim 24, wherein a sample of said bodily fluid is removed from the subject to be diagnosed and steps b and c are conducted in vitro.

27. A method in accordance with claim 24 wherein said nuclei are protons and wherein said at least one moiety is selected from the group consisting of methyl and methylene.

28. A method in accordance with claim 27 wherein said methyl and methylene are associated with the lipids of plasma lipoprotein.

29. A method in accordance with claim 27 additionally comprising suppressing the NMR resonance signal of water.

30. A method in accordance with claim 24 wherein said at least one proton NMR parameter is an average value derived from the resonance lines of methyl and methylene protons.

31. A method in accordance with claim 30 wherein said at least one parameter is the average value of the full widths at half-height of the methyl and methylene proton resonances.

32. A method in accordance with claim 24 wherein said at least one parameter is the full width at half-height of the NMR resonance line of said at least one moiety nuclei.

33. A method in accordance with claim 32 additionally comprising suppressing the NMR resonance signal of water.

34. A method in accordance with claim 24 wherein said at least one parameter is the apparent spin-spin relaxation time $T_2^*$.

35. A method in accordance with claim 24 additionally comprising suppressing the NMR resonance signal of water.

36. The method of claim 24 wherein the C-13 resonance spectrum at 128 and 130 ppm is indicative of the presence of cancer.

37. The method of claim 36 wherein the C-13 resonance between 48 and 80 ppm is indicative of the presence of cancer.

38. A method for diagnosing the presence of cancer in a living patient, comprising
    (a) subjecting a lipid-containing bodily fluid sample from a patient to be tested to C-13 nuclear magnetic resonance spectroscopy to generate an NMR spectrum; and
    (b) classifying the C-13 NMR spectrum into a category of normal C-13 spectrum or into a category of abnormal C-13 spectrum as compared to a predetermined standard for which an abnormal spectrum indicates the presence of cancer.

39. The method of claim 38 wherein the C-13 resonance spectrum at 128 and 130 ppm is indicative of the presence of cancer.

40. The method of claim 38 wherein the C-13 resonance between 48 and 80 ppm is indicative of the presence of cancer.

41. An apparatus for diagnosing the presence of cancer in a living patient by testing a sample of lipid-containing bodily fluid from the patient, said apparatus comprising:
    (a) means for generating a proton NMR spectrum from which undesirable signals have been suppressed from the bodily fluid sample;
    (b) means for measuring the full-width at half-height of a lipoprotein resonance line in said spectrum;
    (c) means for classifying the full width measured into a category of normal full widths or into a category of abnormal full widths as compared to a predetermined standard for which abnormal full widths indicate the presence of cancer;
    (d) means for measuring the triglyceride level of the bodily fluid sample utilized when the bodily fluid sample is classified as having abnormal full widths;
    (e) means for classifying the triglyceride level so measured into a category of normal levels or above normal levels;
    (f) means for generating a C-13 nuclear magnetic spectrum from the bodily fluid sample utilized when said bodily fluid sample is classified as having above normal levels of triglycerides;
    (g) means for classifying the C-13 nuclear magnetic spectrum into a category of normal or abnormal spectrum, for which an abnormal spectrum indicates the presence of cancer.

* * * * *